US009642280B2

(12) United States Patent  (10) Patent No.: US 9,642,280 B2
Chen et al.  (45) Date of Patent: May 2, 2017

(54) SERVER

(71) Applicant: PEGATRON CORPORATION, Taipei (TW)

(72) Inventors: Ko-Wei Chen, Taipei (TW); Wei-Ting Chou, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 14/805,194

(22) Filed: Jul. 21, 2015

(65) Prior Publication Data

US 2016/0037673 A1     Feb. 4, 2016

(30) Foreign Application Priority Data

Jul. 29, 2014   (TW) .............................. 103213442 U

(51) Int. Cl.
  *H05K 7/00*  (2006.01)
  *H05K 7/14*  (2006.01)
  *G06F 1/18*  (2006.01)

(52) U.S. Cl.
  CPC ........... *H05K 7/1489* (2013.01); *G06F 1/185* (2013.01); *H05K 7/1487* (2013.01); *H05K 7/1492* (2013.01)

(58) Field of Classification Search
  CPC combination set(s) only.
  See application file for complete search history.

(56) References Cited

U.S. PATENT DOCUMENTS

| 5,598,318 | A  | * | 1/1997  | Dewitt  | G06F 1/18 |
|   |   |   |   |   | 361/679.57 |
| 6,363,450 | B1 | * | 3/2002  | Lash    | G06F 1/184 |
|   |   |   |   |   | 361/748 |
| 6,618,260 | B2 | * | 9/2003  | Willis  | G06F 1/181 |
|   |   |   |   |   | 361/679.32 |
| 6,639,806 | B1 | * | 10/2003 | Chuang  | G06F 1/184 |
|   |   |   |   |   | 361/748 |
| 6,724,622 | B2 | * | 4/2004  | Liao    | G06F 1/184 |
|   |   |   |   |   | 361/679.31 |
| 6,749,439 | B1 | * | 6/2004  | Potter  | G06F 1/184 |
|   |   |   |   |   | 257/E23.099 |

(Continued)

FOREIGN PATENT DOCUMENTS

TW    I351593      11/2011
TW    201210147    3/2012

*Primary Examiner* — Lisa Lea Edmonds
(74) *Attorney, Agent, or Firm* — Muncy, Geissler, Olds & Lowe, P.C.

(57) ABSTRACT

A server for or accommodating a plurality of first expansion cards. The server includes a housing, a half-width motherboard, a connector and a dual-sided riser card. The half-width motherboard is disposed in the housing. The connector is disposed at a side edge of the half-width motherboard for connecting with one of the first expansion cards. The dual-sided riser card is electrically connected with the half-width motherboard for connecting with another two of the first expansion cards, the dual-sided riser card being substantially perpendicularly disposed at the half-width motherboard, wherein the projection of one of the first expansion cards connected with the dual-sided riser card and the projection of the first expansion card connected with the connector are overlapped at the housing.

10 Claims, 6 Drawing Sheets

(56) References Cited

U.S. PATENT DOCUMENTS

| | | | | |
|---|---|---|---|---|
| 6,754,084 B1* | 6/2004 | Bolognia | ................ | G06F 1/183 361/728 |
| 6,894,895 B2* | 5/2005 | Willis | ..................... | G06F 1/184 361/679.32 |
| 7,639,507 B2* | 12/2009 | Chen | ....................... | G06F 1/185 361/727 |
| 8,422,245 B2* | 4/2013 | Tan | ......................... | G06F 1/184 361/736 |
| 8,690,589 B2* | 4/2014 | Ngo | .................. | H01R 12/7052 439/630 |
| 2004/0240173 A1* | 12/2004 | Yi | .......................... | G06F 1/184 361/679.02 |
| 2008/0106862 A1* | 5/2008 | Liang | .................... | G06F 1/185 361/679.41 |
| 2013/0223035 A1* | 8/2013 | Jhou | ..................... | H05K 3/366 361/785 |

* cited by examiner

SERVER

BACKGROUND

Technology Field

The invention relates to a server and, in particular, to a server that provides a better expansion card performance.

Related Art

Currently cloud information and application can be seen everywhere in daily life, and the developments of different services and network-connected devices make the data amount grow. Therefore, servers play a very important role behind the whole cloud industry.

Presently the demand for server functionality increases, and thus it is desired that expansion cards with best performance can be provided within limited space. Expansion cards can be divided into four types: low profile, FH/FL, FH/HL and HH/FL. FH means full height or standard height, FL means full length, HL means half length, HH means half height, and low profile means half height and half length. Generally speaking, the larger area, the better performance of the expansion card.

An 1U server has many PCI-E lanes, but in view of the space limitation the PCI-E lanes cannot be fully utilized. This results in a lower system performance although the CPUs are fast. Take the Dell R620 server supporting the largest number of I/O cards so far as an example, it has two CPUs and can accommodate more expansion cards. Its space arrangement allows it to accommodate three low profile expansion cards and one Mezzanine expansion card, which cards use 48 pairs of PCIe Gen3 signals. Since one CPU can handle 40 pairs of PCIe Gen3 signals, bandwidths of 32 PCI-E lanes are wasted. Therefore, the performance of the numbers of types of the expansion cards mentioned above cannot fulfill the market demand. Therefore, how to provide a server with higher performance becomes an urgent problem to be solved.

SUMMARY

An objective of the disclosure is to provide a high performance server.

To achieve the objective above, the disclosure provides a server for or accommodating a plurality of first expansion cards. The server includes a housing, a half-width motherboard, a connector and a dual-sided riser card. The half-width motherboard is disposed in the housing. The connector is disposed at a side edge of the half-width motherboard for connecting with one of the first expansion cards. The dual-sided riser card is electrically connected with the half-width motherboard for connecting with another two of the first expansion cards, the dual-sided riser card being substantially perpendicularly disposed at the half-width motherboard, wherein the projection of one of the first expansion cards connected with the dual-sided riser card and the projection of the first expansion card connected with the connector are overlapped at the housing.

In an embodiment, the half-width motherboard includes a first central processing unit and a second central processing unit, the first central processing unit and the second central processing unit are disposed along a longitudinal direction of the half-width motherboard.

In another embodiment, the server further includes a single-sided riser card, the single-sided riser card being disposed at an inner surface of the housing and being electrically connected with the half-width motherboard, a gap existing between the single-sided riser card and the half-width motherboard, the single-sided riser card being for connecting with two of the first expansion cards.

In another embodiment, the single-sided riser card is slidably attached to the inner surface of the housing, the first expansion cards connected with the single-sided riser card, the first expansion card connected with the connector, and one of the first expansion cards connected with the dual-sided riser card are disposed in the gap.

In another embodiment, the single-sided riser card includes a handle, and the handle is exposed to the outside of the housing.

In another embodiment, the half-width motherboard includes a plurality of first electrical contacts, the single-sided riser card includes a plurality of second electrical contacts, and the first electrical contacts and the second electrical contacts are point-to-point connected.

In another embodiment, the first electrical contacts and the second electrical contacts are Mini Serial-Attached SCSI 4i connectors.

In another embodiment, a second expansion card is further disposed at the half-width motherboard, the projection of the second expansion card and the projection of another first expansion card connected with the dual-sided riser card are overlapped at the half-width motherboard.

In another embodiment, the housing has a front window and a rear window, the connector and the dual-sided riser card are near the rear window.

In another embodiment, the dual-sided riser card includes an assembly bracket, the first expansion cards connected with the dual-sided riser card are slidably disposed at the assembly bracket.

Through the embodiments above, the server according to the disclosure has the advantage of higher performance since the combination of the half-width motherboard, the connector and the dual-sided riser card makes the server be capable of accommodating at least three first expansion cards within limited space of the housing.

DETAILED DESCRIPTION OF THE EMBODIMENT

The present invention will be apparent from the following detailed description, which proceeds with reference to the accompanying drawings, wherein the same references relate to the same elements.

Figure 1:
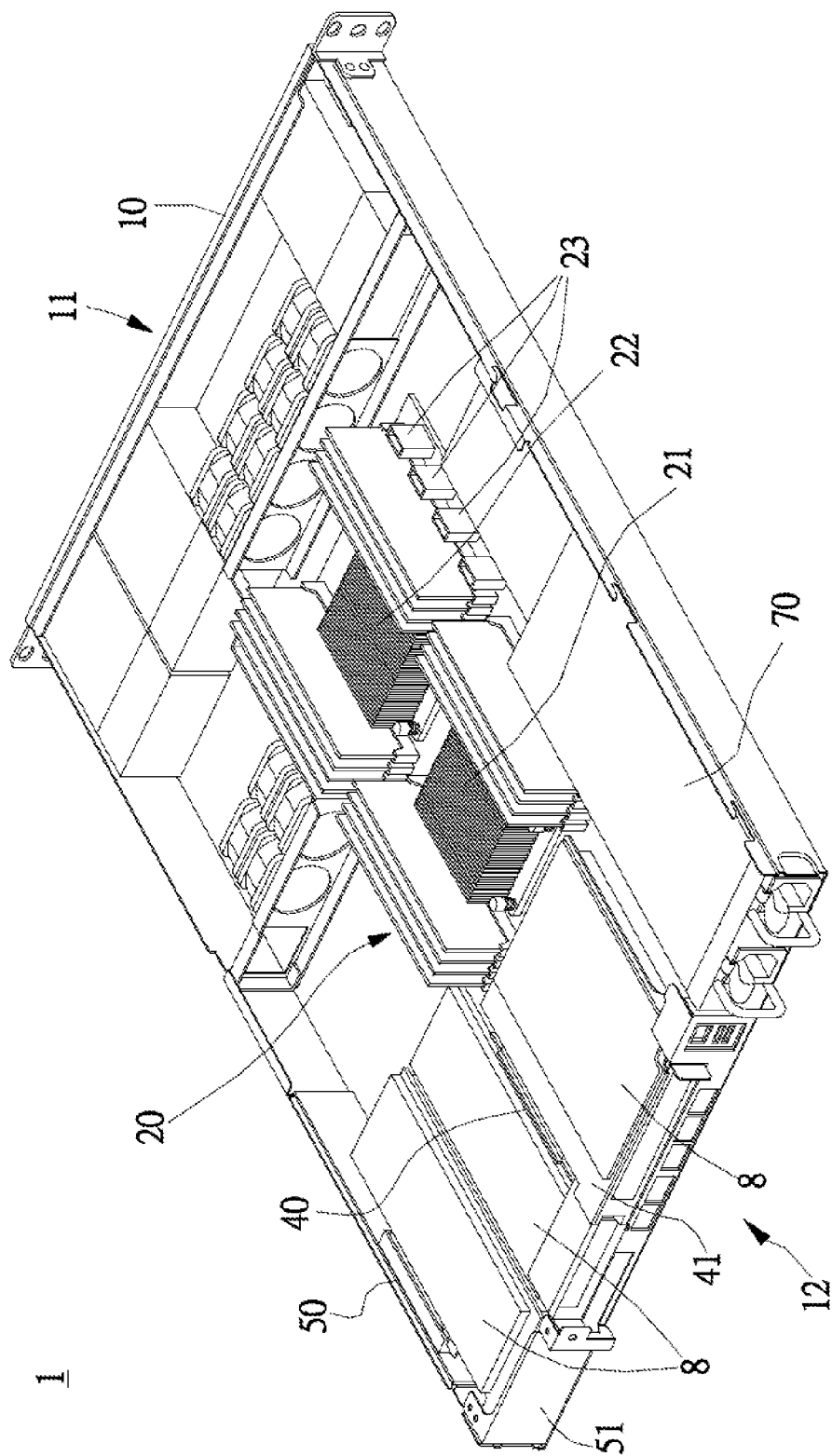
FIG. 1 is an assembled schematic diagram of the server according to an embodiment of the invention.
Figure 2:
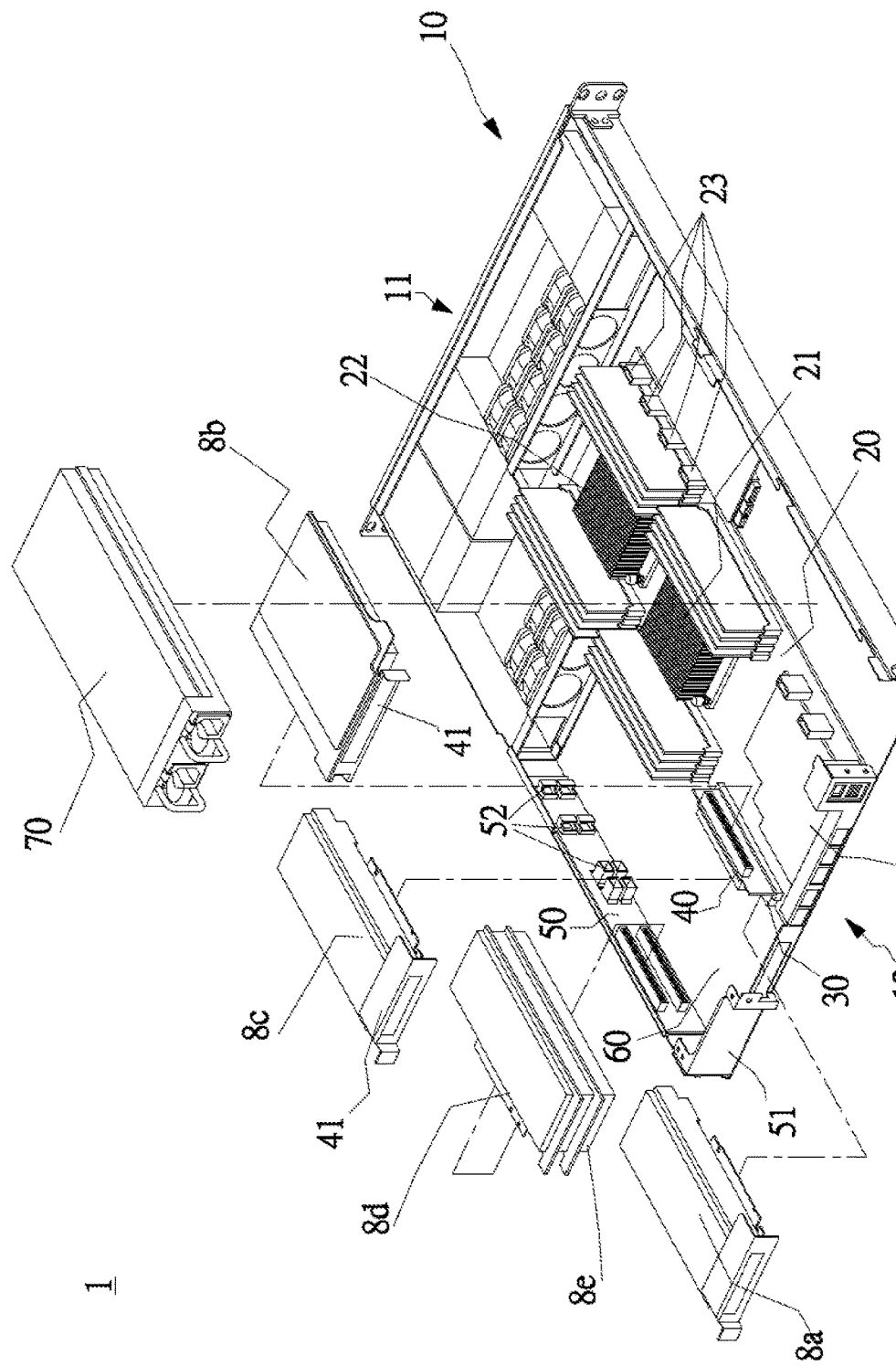
FIG. 2 is an exploded schematic diagram of the server according to an embodiment of the invention.

Referring to FIG. 1, an embodiment of the invention provides a server 1 for accommodating a plurality of first expansion cards 8 and a second expansion card 9 (as shown in FIG. 2). In the embodiment, the server 1 is an 1U server, the first expansion cards 8 transmit data via PCI Express (PCI-E) bus, and may include cards such as a Gigabit Ethernet card, a fiber channel HBA card, an infini-band HBA card, an iSCSI HBA card, a GPGPU card, a RAID (Redundant Array of Independent Disks) card, etc. The first expansion cards 8 may include a low profile card, an FH/FL card, an FH/HL card and an HH/FL card, while the larger area of the expansion cards, the better the performance. In the embodiment, it is preferred to use low profile cards, FH/HL cards and FH/HL cards. The second expansion card 9 is a non-PCI-E expansion card, such as a PCI Mezzanine card without limiting sense. In view of the locations, the first expansion cards 8 may be designated as an A expansion card 8*a*, a B expansion card 8*b*, a C expansion card 8*c*, a D expansion card 8*d* and an E expansion card 8*e*. The A expansion card 8*a*, the C expansion card 8*c*, the D expansion card 8*d* and the E expansion card 8*e* are low profile cards, while the B expansion card 8*b* is an FH/HL type card.

Referring to FIG. 1 and FIG. 2, in the first embodiment of the invention, the server 1 includes a housing 10, a half-width motherboard 20, a connector 30, a dual-sided riser card 40 and a single-sided riser card 50. The half-width motherboard 20, the connector 30 the dual-sided riser card 40 and the single-sided riser card 50 are accommodated in the housing 10. The connector 30, the dual-sided riser card 40 and the single-sided riser card 50 are electrically connected with the half-width motherboard 20 respectively. The housing 10 has a front window 11 and a rear window 12. The front window 11 is for buttons (not shown in the drawing), and the rear window 12 is for exposing I/O connectors for the user to serially connecting multiple servers.

Figure 3:
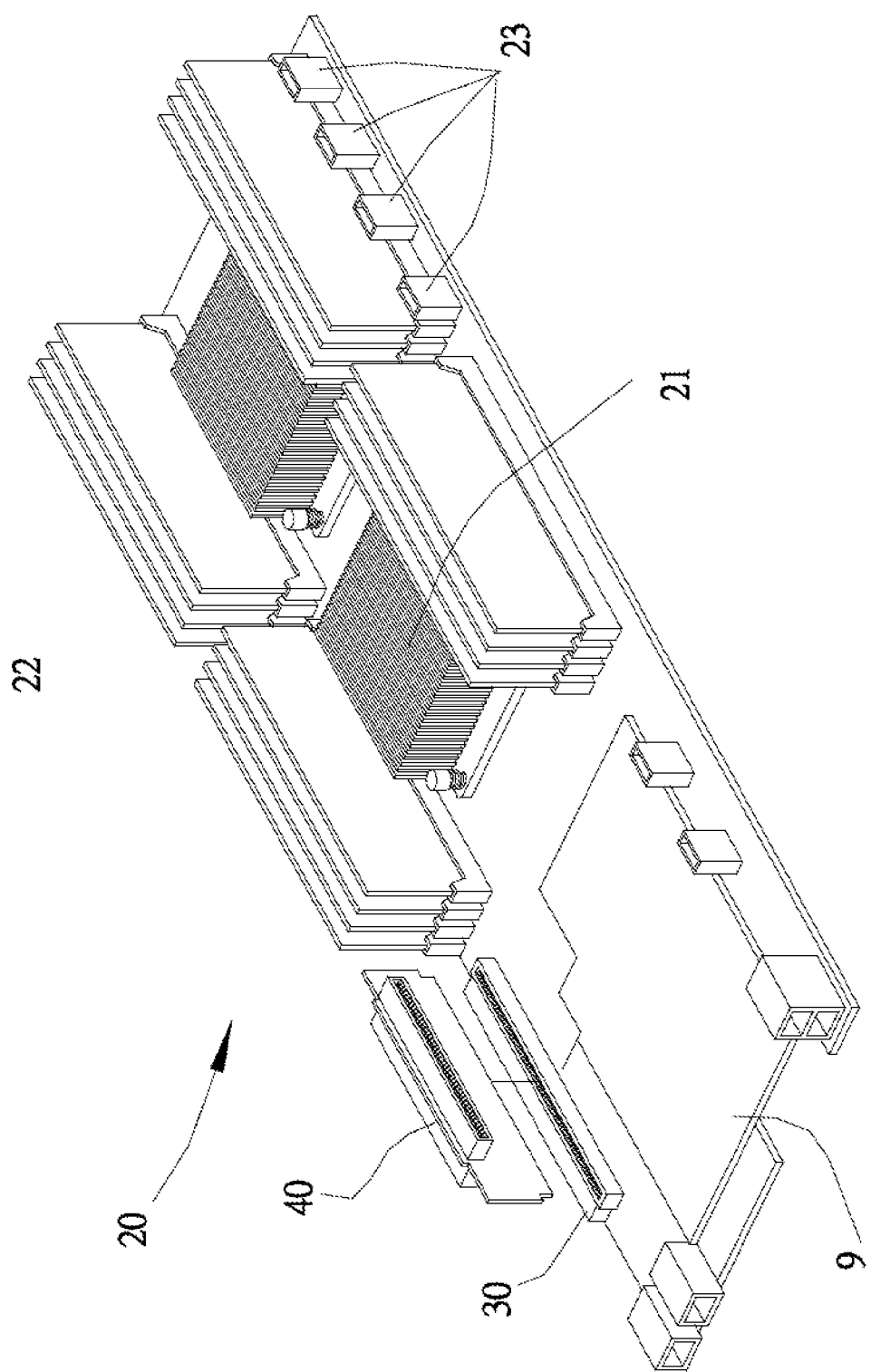
FIG. 3 is a partial schematic diagram of the server according to an embodiment of the invention.

Referring to FIG. 2 and FIG. 3, the size of the half-width motherboard 20 is smaller than an ordinary motherboard for a server. The half-width motherboard 20 is generally in a shape of a rectangular, that is, it has a longitudinal direction. The half-width motherboard 20 includes a first central processing unit 21, a second central processing unit 22 and a plurality of first electrical contacts 23. The first central processing unit 21 and the second central processing unit 22 are disposed on the half-width motherboard 20 in sequence along the longitudinal direction of the half-width motherboard 20. The first central processing unit 21 is near the rear window 12 of the housing 10, the second central processing unit 12 is near the front window 11 of the housing, and the first electrical contacts 23 are disposed around the second central processing unit 22. In this embodiment, the first electrical contacts 23 form a Mini SAS (Mini Serial-Attached SCSI (Small Computer System Interface)) 4i connector to provide point-to-point connections.

Referring to FIG. 2 and FIG. 3, the connector 30 is to provide the slot for PCI-E bus data transmissions. The connector 30 is disposed at a side edge of the half-width motherboard 20 and electrically connected with the first central processing unit 21. In the embodiment, the connector 30 may be connected with 16 pairs of PCI-E signals (that is, PCI-E Gen3 signals). The connector 30 is for connecting with one of the first expansion cards 8, that is, the A expansion card 8*a*. The A expansion card 8*a* is generally parallel to the bottom surface of the housing 10. In the embodiment, the first expansion card 8 (A expansion card 8*a*) connected with the connector 30 is of a low profile type.

Referring to FIG. 2 and FIG. 3, the dual-sided riser card 40 is generally perpendicularly disposed at the half-width motherboard 20, and is disposed beside the connector 30. The two surfaces of the dual-sided riser card provide slots for PCI-E bus data transmission, and connect to two first expansion cards 8. These two first expansion cards 8 are capable of connecting to 16 pairs of PCI-E signals and 8 pairs of PCI-E signals, respectively. When the bottom surface of the half-width motherboard 20 is used as a projection plane, the projection of one first expansion card 8 (that is, the B expansion card 8*b*) connected to the dual-sided riser card 40 and the projection of the second expansion card 9 (which may connect to 8 pairs of PCI-E signals and is electrically connected with the first central processing unit 21) of the half-width motherboard 20 are overlapped. The projection of the other first expansion card 8 (the C expansion card 8*c*) connected to the dual-sided riser card 40 is projected directly on the bottom surface of the housing 10 and is substantially not overlapped with the half-width motherboard 20. The projection of the other first expansion cards 8 connected with the dual-sided riser card 40 and the projection of the first expansion card 8 connected with the connector 30 are overlapped. In the embodiment, the B expansion card 8*b* (8 pairs of PCI-E signals) is electrically connected with the second central processing unit 22 and is an FH/HL card. The C expansion card 8*c* (16 pairs of PCI-E signals) is electrically connected with the first central processing unit 21 and is a low profile card.

Referring to FIG. 1 and FIG. 2, the dual-sided riser card 40 further includes an assembly bracket 41 fixed to the dual-sided riser card 40. In FIG. 2, the assembly bracket 41 is detached for clarity purpose. As shown in FIG. 1, the combination of the assembly bracket 41 and the dual-sided riser card 40 is generally in a T shape. The first expansion card 8 is slidably disposed at the assembly bracket 41. When assembling the dual-sided riser card 40, the first expansion card 8 can be assembled with the assembly bracket 41 and connected with the dual-sided riser card 40 first, and then be assembled with the half-width motherboard 20. When disassembling the dual-sided riser card 40, the first expansion card 8 and the dual-sided riser card 40 can be disassembled together via the assembly bracket 41, and the first expansion card 8 can be separated from the dual-sided riser card 40 by sliding.

Figure 4:
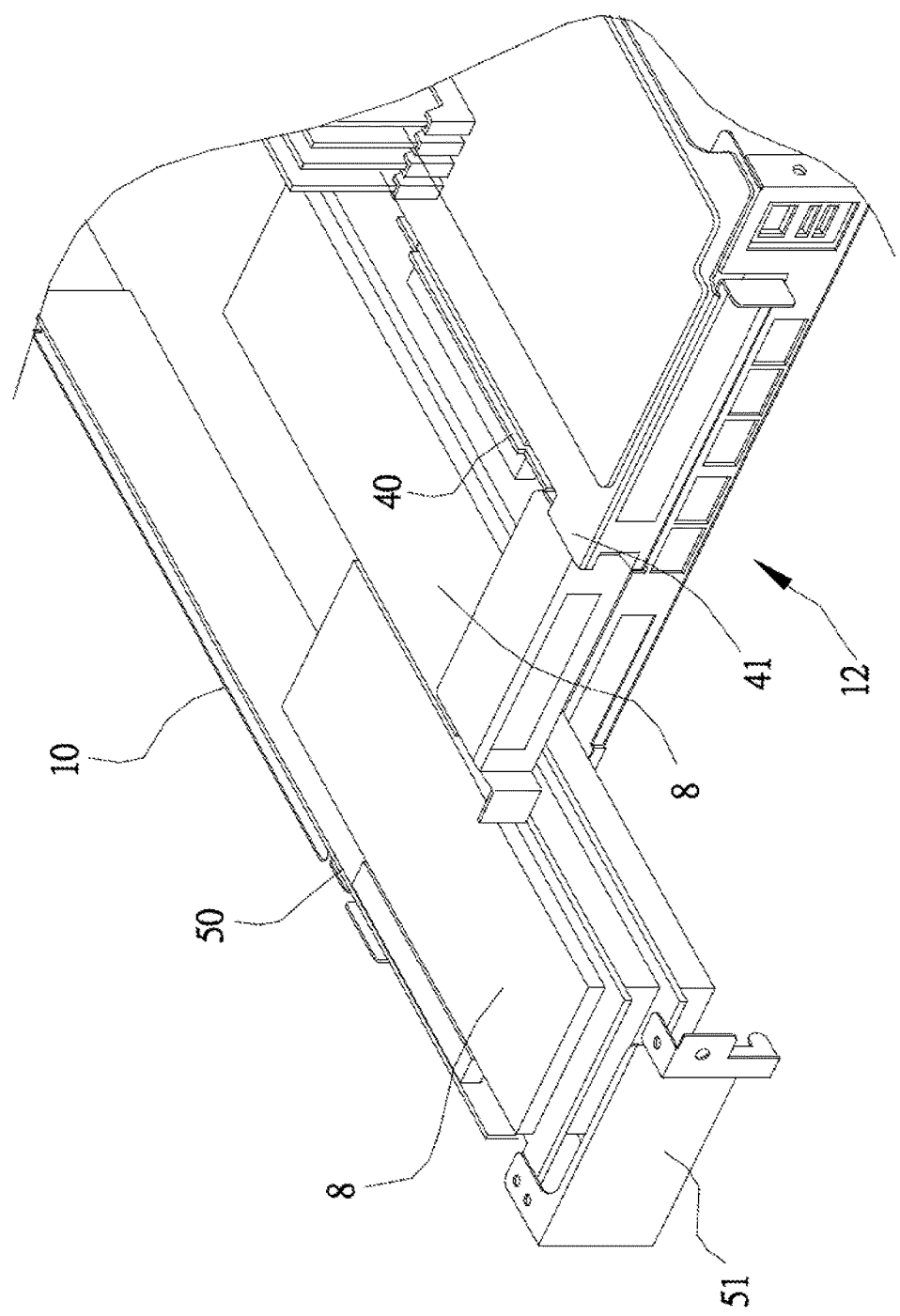
FIG. 4 is an exploded schematic diagram of the server according to an embodiment of the invention.

Referring to FIG. 2 and FIG. 4, the single-sided riser card 50 is slidably disposed at an inner side surface of the housing 10. A gap 60 exists between the single-sided riser card 50 and the half-width motherboard 20 for accommodating the first expansion card 8. The single-sided riser card 50 is for connecting two of the first expansion cards 8, which are the D expansion card 8*d* and the E expansion card 8*e*. Both the D expansion card 8*d* and the E expansion card may be connected with 16 pairs of PCI-E signals, which means that the single-sided riser card 50 may be connected with 32 pairs of PCI-E signals. The D expansion card 8*d* and the E expansion card are connected with the second central processing unit 22. The single-sided riser card 50 includes a handle 51. In the embodiment, the handle 51 is made by sheet metal pressing. The handle 51 may be exposed via the rear window 12 of the housing 10 so that a user can pull out the single-sided riser card 50 and the connected D expansion card 8*d* and the E expansion card 8*e* together by pulling the handle 51. The single-sided riser card 50 also has a plurality of second electrical contacts 52 corresponding to the first electrical contacts 23 to establish for the point-to-point wired connection between the single-sided riser card to fully utilize the second central processing unit 22 of the half-width motherboard 20. In this embodiment, the first expansion card connected to the single-sided riser card 50 is a low profile card.

Referring to FIG. 1, the server 1 may further includes a power source 70. In this embodiment, the power source 70 is a backup battery having two battery cells to avoid the problems of power interrupt or insufficient power amount. From the above, the server 1 according to the first embodiment of the invention can accommodate five first expansion cards 8 and one second expansion card 9, including four low profile first expansion cards 8 and an FH/HL first expansion card 8. The usage of the internal space of the server 1 (1U type) is maximized by the combination of the half-width motherboard 20, the connector 30, the dual-sided riser card 40 and the single-sided riser card 50 to accommodate the most first expansion cards 8. 80 pairs of PCI-E signals can be handled, so that the first central processing unit 21 and the second central processing unit 22 on the half-width motherboard 20 can be fully utilized. Furthermore, with such space configuration, the first expansion card 8 can be near the rear window 12 of the housing 10 to expose the I/O connector.

Figure 5:
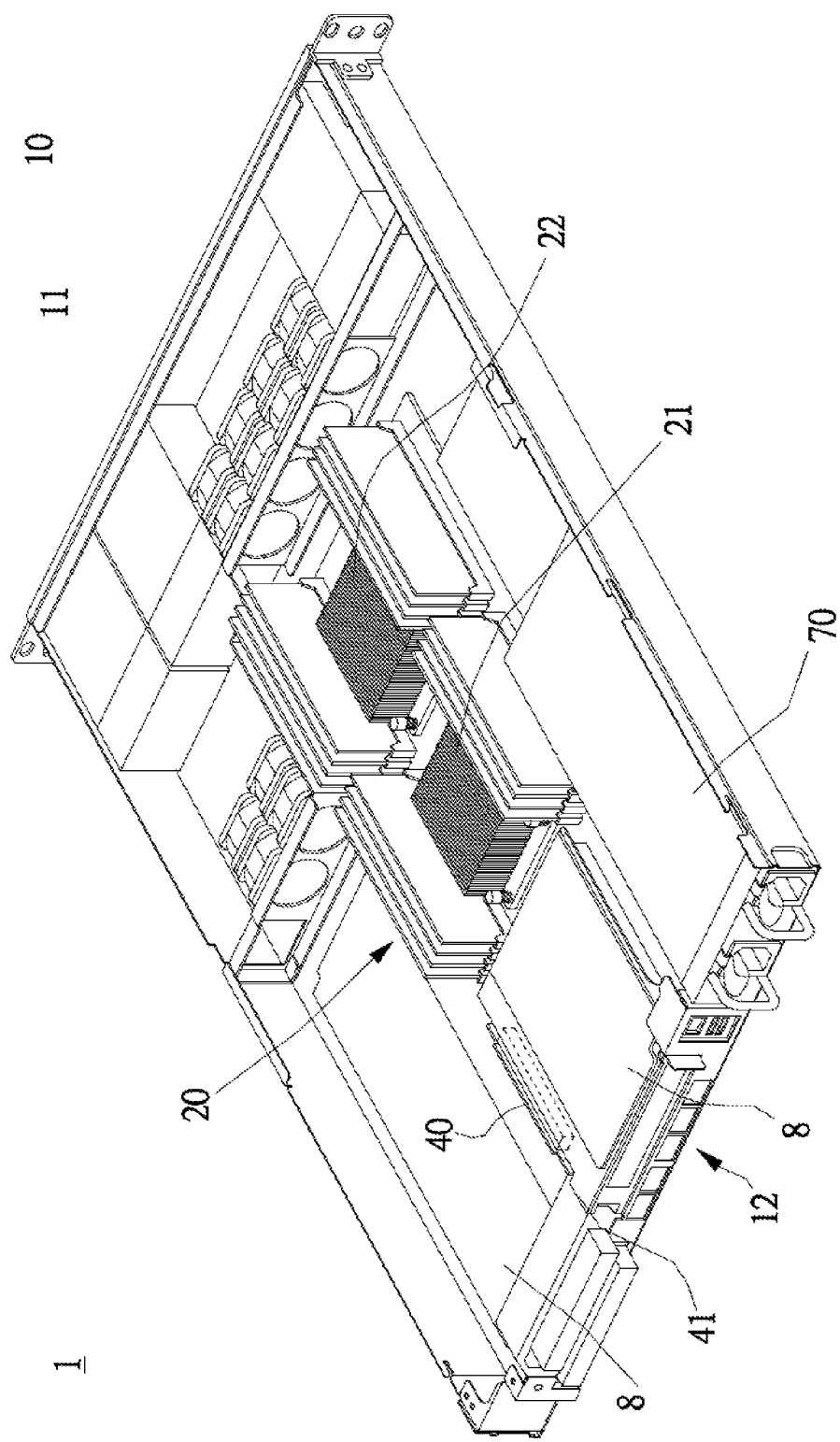
FIG. 5 is an assembled schematic diagram of the server according to another embodiment of the invention.
Figure 6:
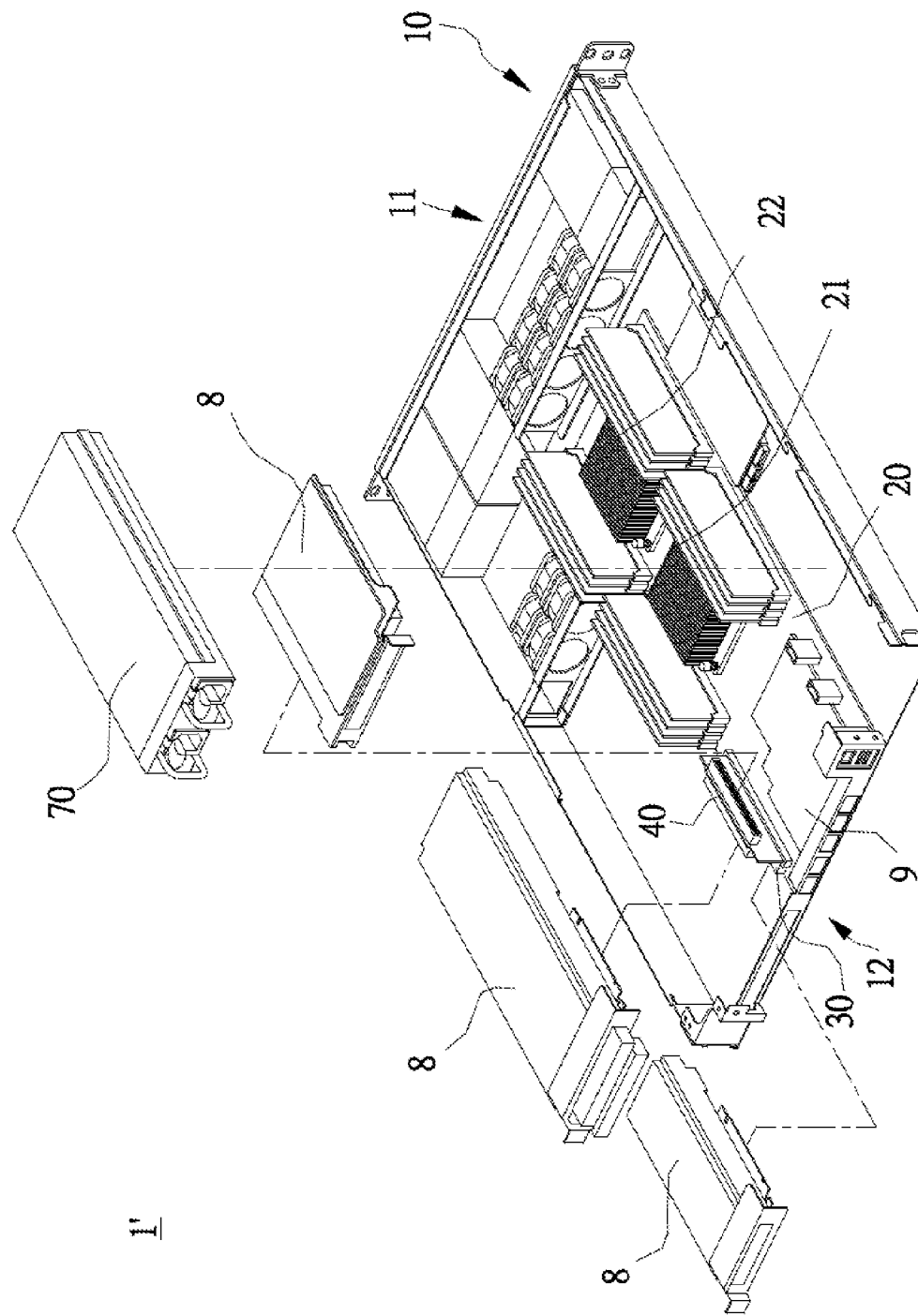
FIG. 6 is an exploded schematic diagram of the server according to another embodiment of the invention.

Referring to FIG. 5 and FIG. 6, in the second embodiment of the invention, the server 1 includes a housing 10, a half-width motherboard 20, a connector 30 and a dual-sided riser card 40, while the single-sided riser card 50 is not included. The first expansion card 8 connected with the connector 30 is an FH/FL first expansion card 8. Among the first expansion cards 8 connected with the dual-sided riser card 40, the one overlapped with the projection of the half-width motherboard 20 is an FH/HL first expansion card 8, while another one is an FH/FL first expansion card 8. From the above, in the second embodiment of the invention, the server 1 can accommodate one FH/HL and two FH/FL first expansion cards.

To sum up, the server according to the invention has the advantage of higher performance since the combination of the half-width motherboard, the connector and the dual-sided riser card makes the server be capable of accommodating at least three or at least five first expansion cards within limited space of the housing.

The descriptions above are just embodiments of the invention without disclosing all possible combinations for concise purpose. Persons having ordinary skill in the art should understand that it is not necessary that all of the modules or elements described above are necessary. Furthermore, to implement the invention, conventional modules or elements may be added. Each module or element may be omitted or revised, and other module or element may exist between any two elements or modules.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A server for accommodating a plurality of first expansion cards, the server comprising:
   a housing;
   a half-width motherboard disposed in the housing;
   a connector disposed at a side edge of the half-width motherboard for connecting with one of the first expansion cards;
   a dual-sided riser card electrically connected with the half-width motherboard for connecting with another two of the first expansion cards, the dual-sided riser card being substantially perpendicularly disposed at the half-width motherboard and being disposed beside the connector, wherein the projection of one of the first expansion cards connected with the dual-sided riser card and the projection of the first expansion card connected with the connector are overlapped at the housing.

2. The server according to claim 1, wherein the half-width motherboard comprises a first central processing unit and a second central processing unit, the first central processing unit and the second central processing unit are disposed along a longitudinal direction of the half-width motherboard.

3. The server according to claim 1, further comprising a single-sided riser card, the single-sided riser card being disposed at an inner surface of the housing and being electrically connected with the half-width motherboard, a gap existing between the single-sided riser card and the half-width motherboard, the single-sided riser card being for connecting with two of the first expansion cards.

4. The server according to claim 3, wherein the single-sided riser card is slidably attached to the inner surface of the housing, the first expansion cards connected with the single-sided riser card, the first expansion card connected with the connector, and one of the first expansion cards connected with the dual-sided riser card are disposed in the gap, whereby the first expansion cards connected with the dual-sided riser card are of HH/HL and FH/HL types, and the HH/HL first expansion card connected with the dual-sided riser card is overlapped with the first expansion card connected with the connector, the first expansion cards connected with the single-sided riser card are of HH/HL type.

5. The server according to claim 4, wherein the single-sided riser card comprises a handle, and the handle is exposed to the outside of the housing.

6. The server according to claim 5, wherein the half-width motherboard comprises a plurality of first electrical contacts, the single-sided riser card includes a plurality of second electrical contacts, and the first electrical contacts and the second electrical contacts are point-to-point connected.

7. The server according to claim 6, wherein the first electrical contacts and the second electrical contacts are Mini Serial-Attached SCSI 4i connectors.

8. The server according to claim 1, wherein a second expansion card is further disposed at the half-width motherboard, the projection of the second expansion card and the projection of another first expansion card connected with the dual-sided riser card are overlapped at the half-width motherboard.

9. The server according to claim 1, wherein the housing has a front window and a rear window, the connector and the dual-sided riser card are near the rear window, the server further comprises a power source, the power source is disposed in the housing.

10. The server according to claim 1, wherein the dual-sided riser card comprises an assembly bracket, the first expansion cards connected with the dual-sided riser card are slidably disposed at the assembly bracket.

* * * * *